(12) United States Patent
Deng et al.

(10) Patent No.: US 10,461,772 B1
(45) Date of Patent: Oct. 29, 2019

(54) CODE CONVERSION

(71) Applicant: INTERNATIONAL BUSINESS MACHINES CORPORATION, Armonk, NY (US)

(72) Inventors: Jiangang Deng, Beijing (CN); Patrick Leo Glenski, Rochester, MN (US); He Lei Liu, Beijing (CN); Xiao Ling Chen, Beijing (CN); Zi Wen Zhang, Beijing (CN); Jiang Yi Liu, Beijing (CN); Yan Huang, Beijing (CN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/246,736

(22) Filed: Jan. 14, 2019

(51) Int. Cl.
*H03M 7/14* (2006.01)
*G06F 17/22* (2006.01)
*H03M 7/30* (2006.01)

(52) U.S. Cl.
CPC .......... *H03M 7/14* (2013.01); *G06F 17/2217* (2013.01); *G06F 17/2252* (2013.01); *H03M 7/30* (2013.01)

(58) Field of Classification Search
CPC ....... H03M 7/14; H03M 7/30; G06F 17/2252; G06F 17/2217
USPC ............................................ 341/87, 106, 67
See application file for complete search history.

(56) References Cited

U.S. PATENT DOCUMENTS

| | | | | |
|---|---|---|---|---|
| 5,600,772 A | * | 2/1997 | Zhou | ........................ G06T 11/40 345/170 |
| 5,699,524 A | * | 12/1997 | Ooishi | ................ G06F 17/2217 358/1.15 |
| 5,793,970 A | * | 8/1998 | Fakes | ..................... G06Q 10/10 379/93.24 |
| 6,204,782 B1 | | 3/2001 | Gonzalez et al. | |
| 7,051,278 B1 | | 5/2006 | Ehrman | |
| 7,218,252 B2 | | 5/2007 | Fauque | |
| 9,048,854 B2 | | 6/2015 | Laviolette | |
| 2015/0085328 A1 | | 3/2015 | Okayama | |

OTHER PUBLICATIONS

"Method to consolidate mapping tables use in character conversion" IP.com Disclosure No. IPCOM000196504D Publication Date: Jun. 3, 2010, 3 pages.

\* cited by examiner

*Primary Examiner* — Brian K Young
(74) *Attorney, Agent, or Firm* — Cantor Colburn LLP; William Kinnaman

(57) ABSTRACT

Methods of code conversion are provided. Aspects include obtaining a first code point from a source data string in a first character encoding, wherein the source data string is to be converted to a target data string in a second character encoding. A target code point corresponding to the first code point is looked up in a map table, wherein the target code point is in the second character encoding. It is determined whether the first code point is a first combining character in response to receiving a lookup failure generated from the looking up operation. A combination unit having the first combining character and a base character next to the first combining character in the source data string is identified in response to determining that the first code point is the first combining character. The combination unit is converted to a substitute character in the target data string.

20 Claims, 7 Drawing Sheets

CODE CONVERSION

BACKGROUND

The present invention relates to data processing, and more specifically, to code conversion.

With the ongoing globalization of business and network, it has become important for computers or other electronic devices to be able to handle multiple character encodings. So there is a need to be able to convert from one character set encoding to another encoding. For example, The Unicode™ standard (hereafter simply Unicode or Unicode standard) was developed to provide an international character encoding standard. Unicode is a computing industry standard for the consistent encoding, representation, and handling of text expressed in most of the world's writing systems. Although most of computer systems or applications can support Unicode standard, some computer systems or applications still have its own character encoding standard. Hence, when such computer systems or applications receive Unicode data stream from other computer systems or applications, there is a need for code conversion from Unicode character encoding to a target character encoding understood by such computer systems or applications.

SUMMARY

Embodiments of the present invention disclose a method, a system and computer program product. According to one embodiment of the present invention, a first code point is obtained from a source data string in a first character encoding, wherein the source data string is to be converted to a target data string in a second character encoding. A target code point corresponding to the first code point is looked up in a map table, wherein the target code point is in the second character encoding. It is determined whether the first code point is a first combining character in response to receiving a lookup failure generated from the looking up operation. A combination unit comprising the first combining character and at least one base character next to the first combining character in the source data string is identified in response to determining that the first code point is the first combining character. The combination unit is converted to a substitute character in the target data string.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
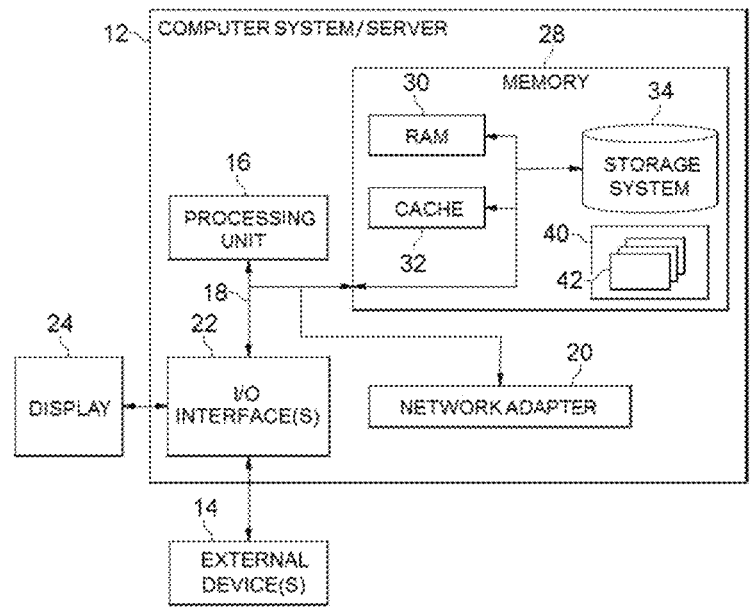
FIG. 1 depicts a cloud computing node according to an embodiment of the present invention.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12 or a portable electronic device such as a communication device, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
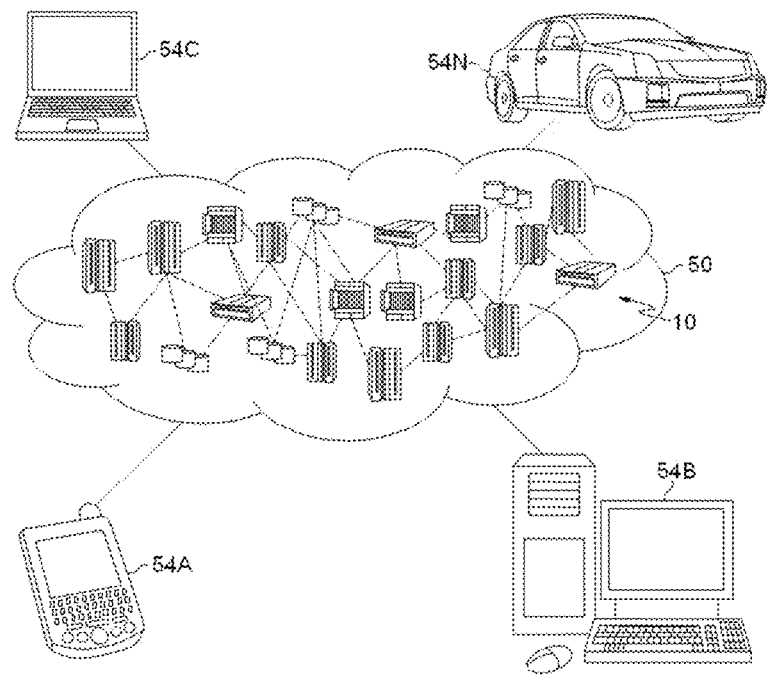
FIG. 2 depicts a cloud computing environment according to an embodiment of the present invention.

Referring now to FIG. 2, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
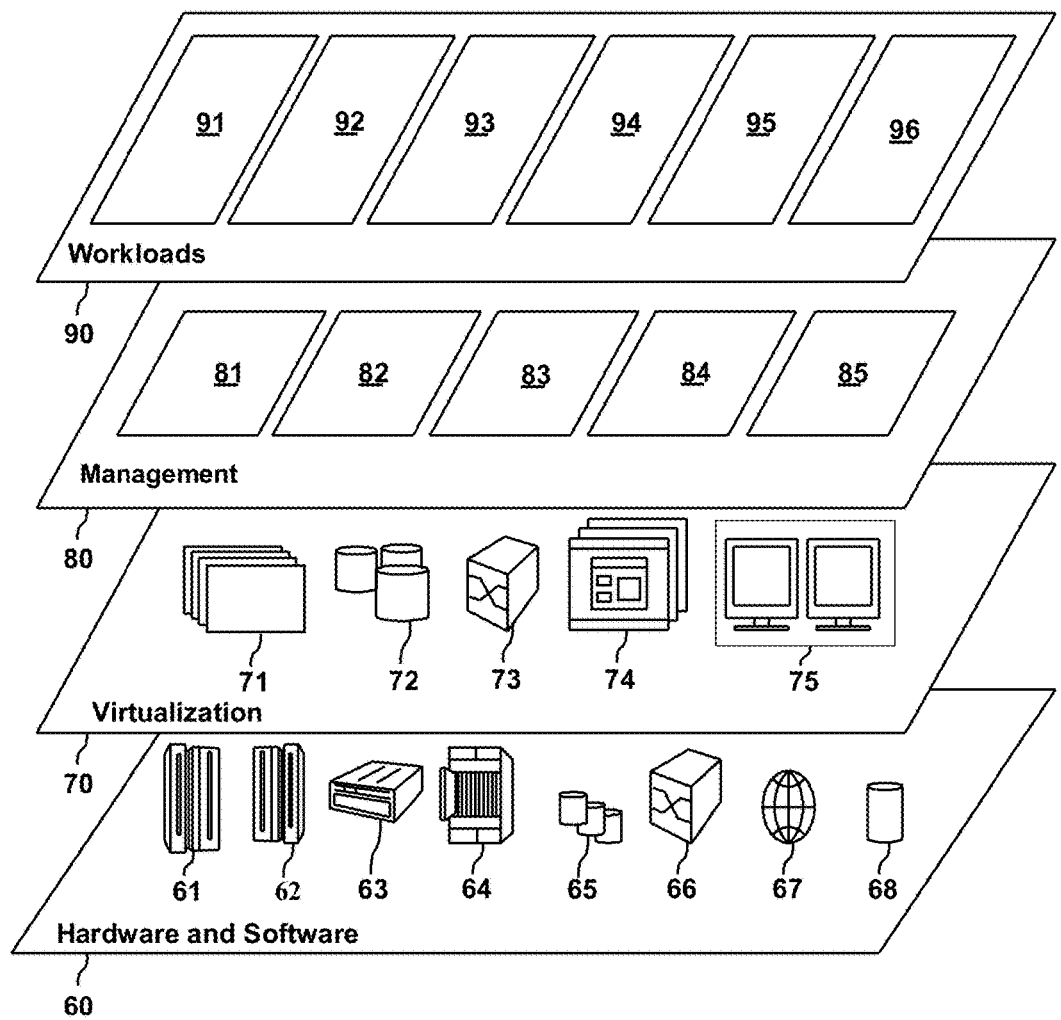
FIG. 3 depicts abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and code conversion processing 96.

To make those in the art better understand present disclosure, the following fundamental concepts regarding to code conversion are introduced herein.

Code point: a code point is a bit pattern in a particular encoding. Usually the bit pattern is one or more bytes long. For example, a Unicode code point is 16 bits or two bytes.

Encoding: An encoding is a one-to-one mapping between a set of characters and a set of code points. For example, UTF-8 is an encoding of the Unicode character set, so it maps the number assigned to each character in Unicode to some sequence of bytes.

With the development of code standard, more and more combining characters are added into the combining character sets. In digital typography, combining characters are characters that are intended to modify other characters (hereafter simply base character) to create a new character. Combining characters include combining single characters and combining double characters. A combining single character is intended to modify a single base character. For example, a Unicode code point <U+0301> indicates a combining single character ( ́). A Unicode code point <U+0041> indicates a base character (A). <U+0041 U+0301> indicates that the combining single character ( ́) combines a base character (A) to create a combined character (Á). A combining double character is intended to modify two base characters. For example, a Unicode code point <U+006F> indicates a base character (o), and a Unicode code point <U+035D> indicates a combining double character ( ͝ ), <U+006F U+035D U+006F> indicates that the combining double character ( ͝ ) combines two base characters "o" to create a combined character (o͝o). When a data string including combining characters is converted to a target string in a target encoding, a combining character may be converted to a substitute character in the target string, which leads to an increased length of a target data string. As a result, truncation or overwriting may occur because the length of target character encoding is beyond the fixed length of data that some applications can process. As known, truncation or overwriting may result in program exception interrupt, dead cycle and uncontrollable data loss etc. Although this issue can be resolved by modifying application programs, it can bring about great labor cost to modify, test and compile programs for an enterprise application deployed on a large number of distributed nodes. Therefore, there is a need to process code conversion for the data string including combining characters without modifying the existing programs.

Figure 4:
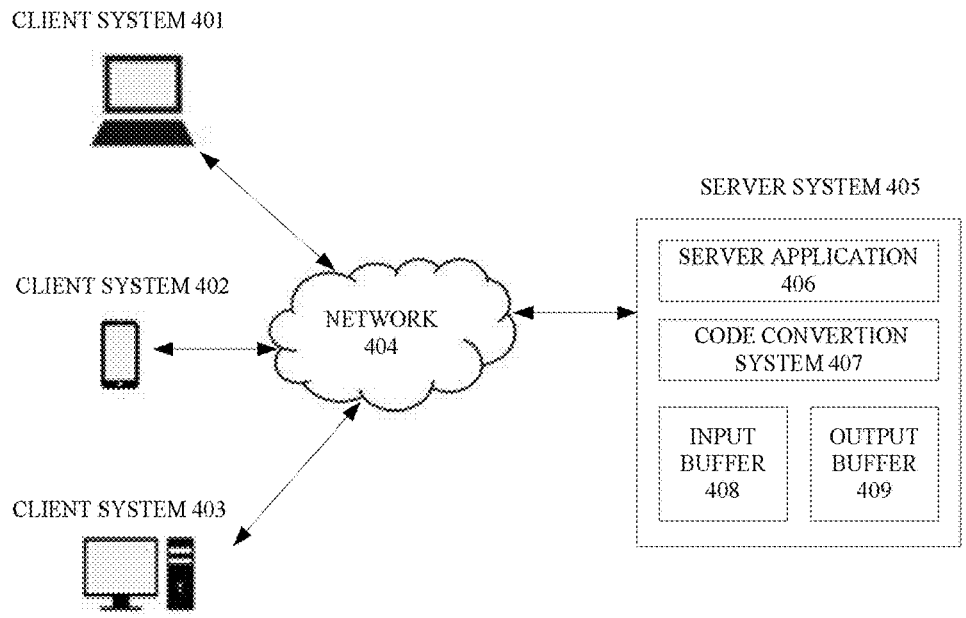
FIG. 4 depicts System architecture 400 according to an embodiment of the present invention.

With reference now to FIG. 4, a system architecture 400 according to an embodiment of the present invention is depicted. The system 400 may include client systems 401, 402 and 403 coupled to a server system 405 over the network 404. Although the server system 405 and the client systems 401, 402 and 403 are illustrated in FIG. 4, any number of server system and client system may be presented in the system architecture 400. The client systems 401, 402 and 403 could be a desktop computer, a laptop computer or a portable computing device, etc. The server system 405 could be implemented by the computer system/server 12 illustrated in FIG. 1. Also, the system architecture 400 could be implemented in a cloud computing environment illustrated in FIG. 2.

The server system 405 may include a server application 406 and a code conversion system 407. The server application 406 may comprise one or more related processes to be executed by the server system 405 to deliver certain service. The server application 406 may include a server application API. The client systems 401, 402 and 403 may access certain server system resources of the server system 405 for example the server application 406 via the server application API. The server system 405 can work in a second character encoding. A source data string in a first character encoding coming from the client systems 401, 402 and 403 can be received by the server system 405. The code conversion system 407 can convert the source data string from the first character encoding to a second character encoding.

Figure 5:
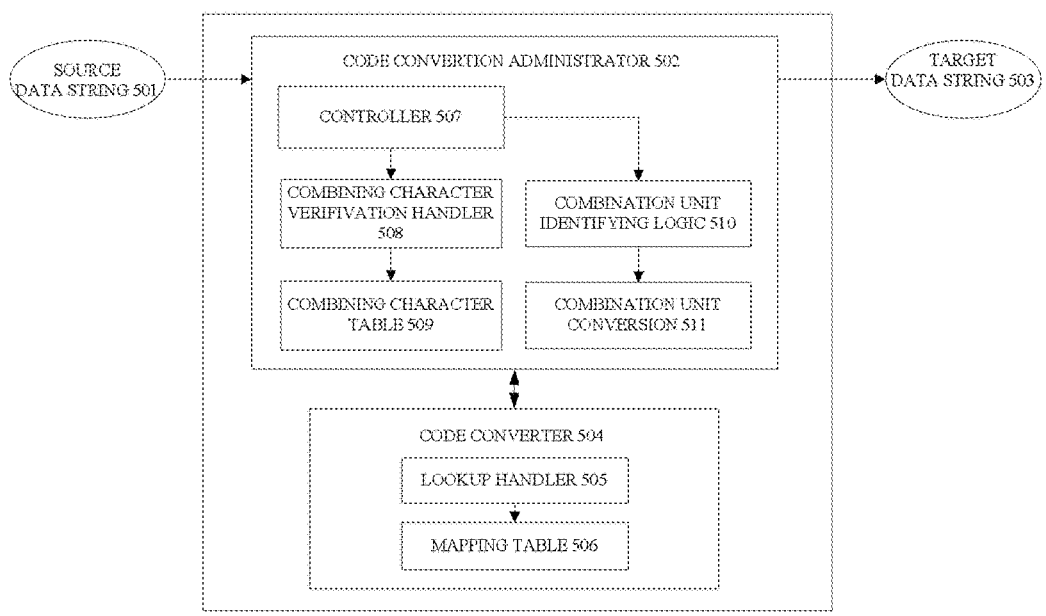
FIG. 5 depicts a block diagram of the code conversion system 407 according to an embodiment of the present invention.

FIG. 5 depicts a block diagram of the code conversion system 407 according to an embodiment of the present invention. The code conversion system 407 can receive the source data string 501 and output the target data string 503. The code conversion system 407 includes a code conversion administrator 502 and a code converter 504. The code conversion administrator 502 can interact with the code converter 504 to administrate the code conversion process. The code converter 504 can be operated to convert a source data string 501 to a target data string 503 in different encoding. The code converter 504 includes a lookup handler 505 and a mapping table 506. Code conversion administrator 502 includes a controller 507, a combining character verification handler 508, a combining character table 509, a combination unit identifying logic 510 and a combination unit converter 511.

Figure 6:
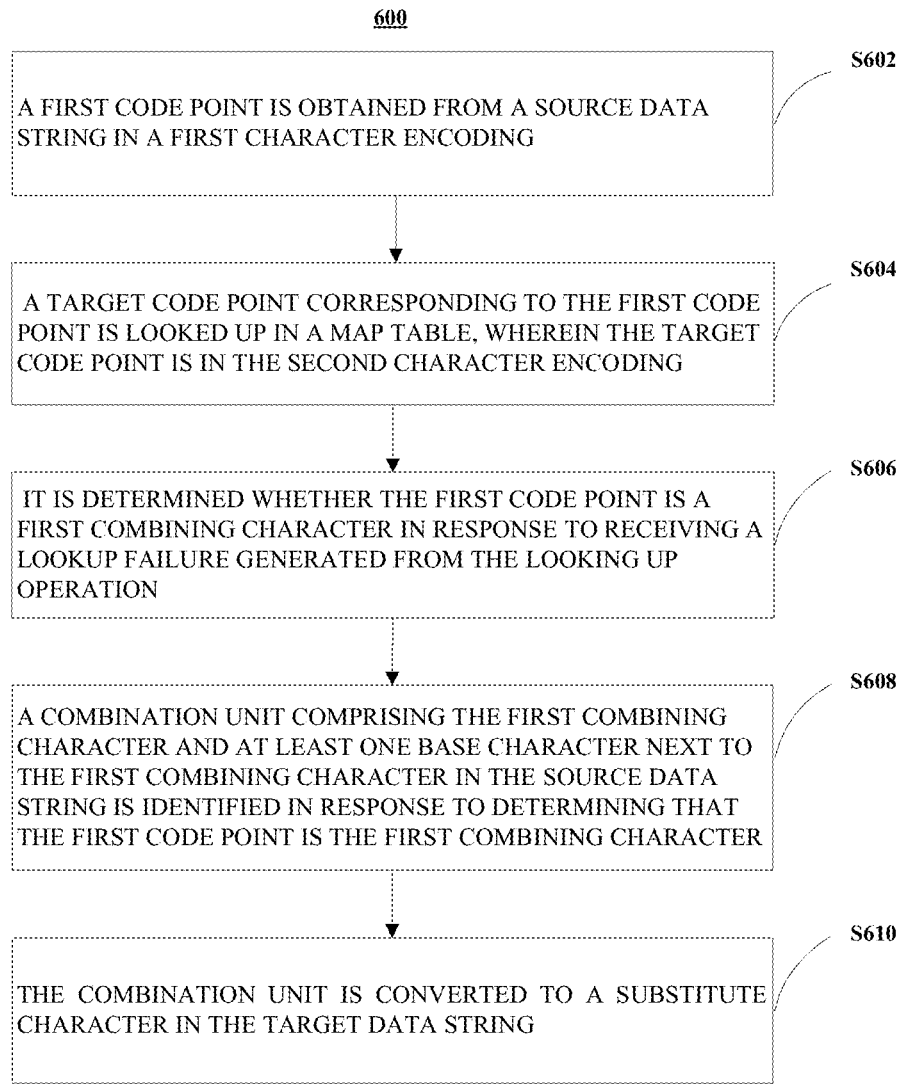
FIG. 6 describes an example method of code conversion in the code conversion system 407 according to an embodiment of the present invention.

FIG. 6 describes an example method of code conversion in the code conversion system 407 according to an embodiment of the present invention. With reference now to FIG. 6, starting at step S602, a first code point is obtained from a source data string in a first character encoding, wherein the source data string is to be converted to a target data string in a second character encoding. At step S604, a target code point corresponding to the first code point is looked up in a map table, wherein the target code point is in the second character encoding. At step S606, it is determined whether the first code point is a first combining character in response to receiving a lookup failure generated from the looking up operation. At step S608, a combination unit comprising the first combining character and at least one base character next to the first combining character in the source data string is identified in response to determining that the first code point is the first combining character. At step S610, the combination unit is converted to a substitute character in the target data string.

At step S602, the client system 401 can access the server application 406 via the server application API in the server system 405. A source data string in a first character encoding from the client system 401 can be received by the server application 406. The source data string can be cached in an input buffer 408. In response to the server application 406 invoking the code conversion system 407, the code conversion administrator 502 can instruct the code converter 504 to convert the source data string in the input buffer 408 to a target data string in a second character encoding. In response to receiving the instruction from the code conversion administrator 502, the code converter 504 can acquire an access address pointer of the input buffer 408 and data length of the source data string from the instruction. The code converter 504 can obtain a first code point in the first character encoding from the input buffer 408.

At step S604, after obtaining the first code point, the lookup handler 505 can look up a target code point corresponding to the first code point in a mapping table 506. The mapping table 506 can be designed to map a single code point in a first character encoding to a target code point in the second character encoding. If a target code point in the second character encoding can be found in the mapping table 506, the target code point can be written into a cache in the code conversion system 407. Then the address pointer of the source data string can move to the next code point. If target code points for all code points of the data string to be processed can be found in the mapping table 506, the target code points can be transferred to an output buffer 409, the conversion process for the source data string from the first character encoding to the second character encoding is completed.

At step S606, in response to receiving a lookup failure generated from the looking up operation, it is determined whether the first code point is a first combining character. If the lookup handler 505 cannot obtain a target code point in the second encoding in the mapping table 506, the code converter 504 may report a lookup failure to the controller 507 in the code conversion administrator 502. At the same time, the offset of the access address pointer of the input buffer 408 may be sent to the controller 507 by the code converter 504. In response to receiving a lookup failure from the code converter 504, the controller 507 may obtain the code point related to the lookup failure based on the offset of the access address pointer of the input buffer 408. The controller 507 may trigger the combining character verification handler 508 to identify if the lookup failure is caused by a combining character via the combining character table 509. In response to receiving a lookup failure, the combining character verification handler 508 may search the first code point related to the lookup failure in the combining character table 509. The combining character table 509 may include all combining characters defined by the first character encoding standard. The combining character table 509 may include two parts. One part is comprised of combining single characters and the other part is comprised of combining double characters. So, it can be determined whether the first code point is a first combining character based on the search result. Also, it can be determined whether the first combining character is a combining single character or a combining double character according to which part the code point related to the lookup failure belongs to.

At step S608, if the first code point can be found in the combining character table 509, then the combining character verification handler 508 can determine that the first code point is a first combining character. At the same time, the combining character verification handler 508 can determine that whether the first combining character is a combining single character or a combining double character according to which part the code point belongs to. If the first code point cannot be found in the combining character table 509, the combining character verification handler 508 can determine that the first code point is a base character. In response to determining that the lookup failure is caused by the first combining character, the controller 507 may trigger the combination unit identifying logic 510 to identify a combination unit comprising the first combining character and at least one of base character next to the first combining character.

Figure 7:
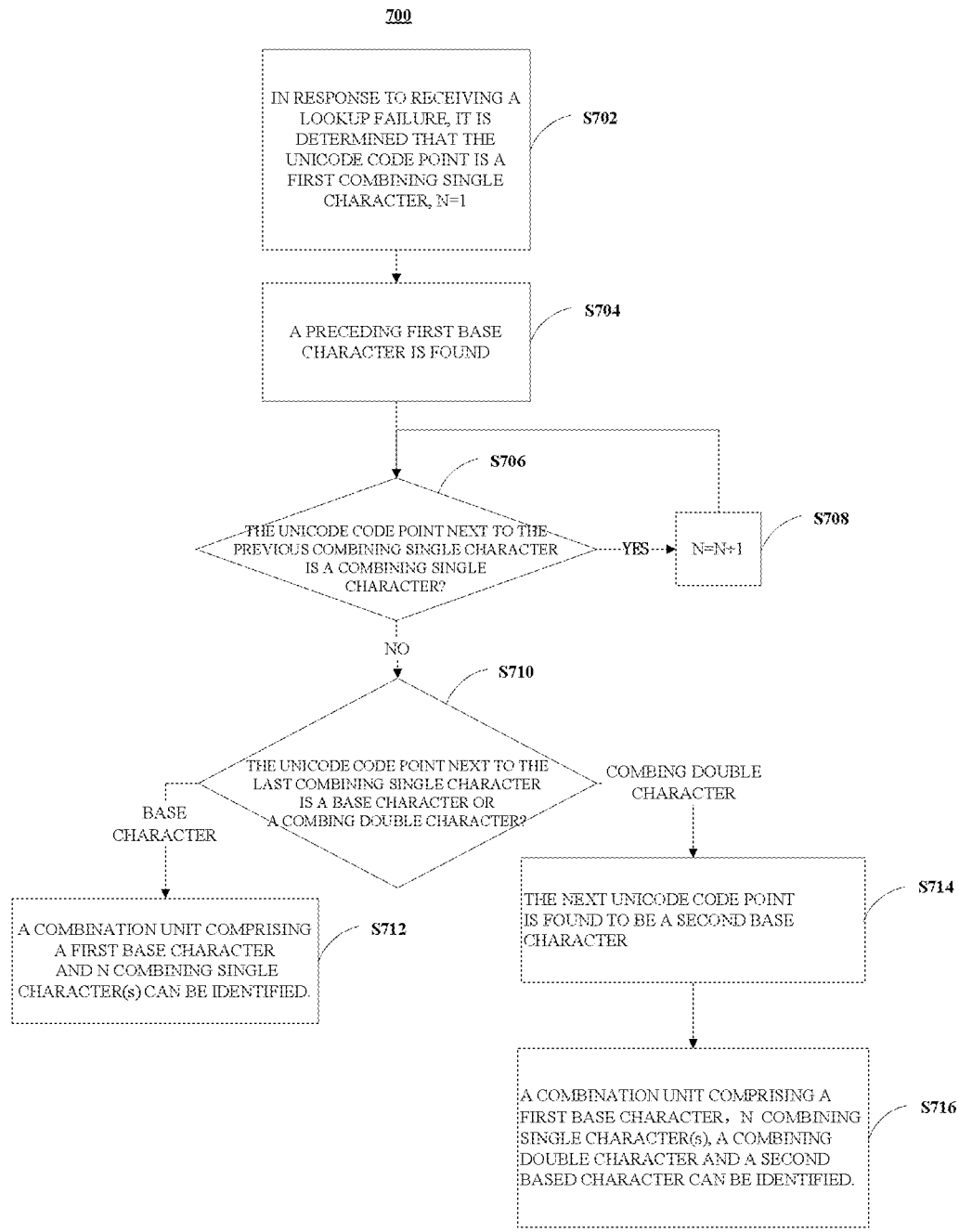
FIG. 7 describes a flowchart of an example method 700 for identifying a combination unit according to an embodiment of the present invention.

FIG. 7 depicts a flowchart of an example method 700 for identifying a combination unit in the Unicode character encoding according to an embodiment of the present invention. Assuming the received source data string is in the Unicode character encoding. A Unicode code point is obtained from the source data string, a target code point corresponding to the Unicode code point is looked up in the map table. The code converter 504 can look up the target code point corresponding to the Unicode code point in the mapping table 506, wherein the target code point is in a second character encoding. The method 700 starts at step S702, in response to receiving a lookup failure, it is determined that the Unicode code point is a first combining single character, and N is set to be "1". At step S704, a first base character is found preceding the first combining single character. The first combining single character is next to the first base character in the source data string. At step S706, it is determined whether the Unicode code point next to the previous combining single character is a combining single character. If the determination result is "Yes", then the method goes to the step S708 and "N+1" is assigned to "N". Then the method goes back to step S706. The loop from step S706 to step S706 would not stop until the next Unicode code point is found not to be a combining single character. If the determination result is "No", at step S710, it is determined that whether the Unicode code point next to the last combining single character is a base character or a combining double character. If the determination result is a base character, a combination unit comprising a first base character and N combining single character(s) (N≥1, N∈integer) can be identified. If determination result is a combining double character, the method goes to step S714, the next Unicode code point is found to be a second base character. Then at step S716, a combination unit comprising a first base character, N combining single character(s) (N≥1, N∈integer), a combining double character and a second base character can be identified.

Figure 9:
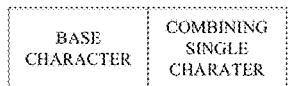
FIG. 9 depicts example combination units according to embodiments of the present invention.
Figure 9:
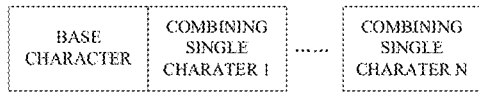
Figure 9:
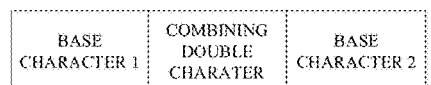
Figure 9:
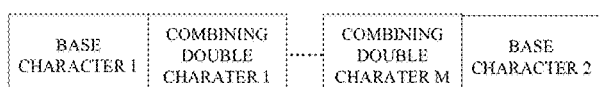
Figure 9:
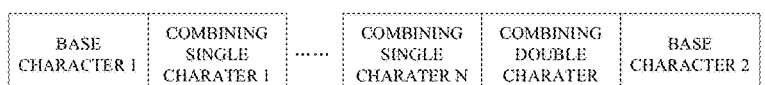
Figure 9:
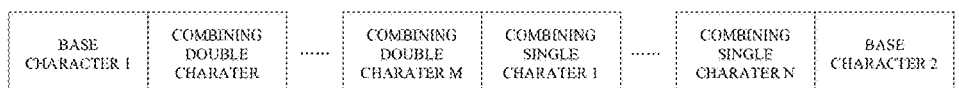

According to one embodiment, the first combining character is a first combining single character. If N=1, the combination unit may comprise a first base character and a first combining single character. The first base character is preceding to the first combining single character in the source data string. The base character can be obtained based on the location relationship with the first combining single character. FIG. 9 depicts example combination units according to embodiments of the present invention. The combination unit 1 in FIG. 9 is an exemplary combination unit according to the embodiment of the present invention. The combination unit 1 comprises a base character and a combining single character.

According to one embodiment, the first combining character is a first combining single character. If N>1, the combination unit may comprise a first base character and N combining single characters, wherein the N combining single characters include a first combining single character and the other (N−1) combining single character(s). The first base character is next to the N combining single characters in the source data string. The first base character is preceding to the N combining single characters in the source data string. The other (N−1) combining single character(s) is followed by the first combining single character in the source data string. The first base character and the other (N−1) combining single character can be obtained based on the location relationship with the first combining character. The combination unit 2 in FIG. 9 is an example combination unit according to the embodiment of the present invention. The combination unit 2 comprises a base character and N combining single characters (N≥1, N∈integer).

According to one embodiment, the first combining character is a first combining single character. The combination unit comprises a first base character, N combining single character(s), a first combining double character and a second base character. Wherein the N combining single character(s) include a first combining single character and the other (N−1) combining single character(s). The first base character is preceding to the first combining single character in the source data string. The other (N−1) combining single character(s) is followed by the first combining single character. The N combining single character(s) and the first combining double character are between the first base character and the second character. The first base character, the other (N−1) combining single characters, the first combining double character and the second base character can be obtained based on the location relationship with the first combining single character. The combination unit 5 in FIG. 9 is an example combination unit according to the embodiment of the present invention. The combination unit 5 comprises a base character 1, N combining single character(s) (N≥1, N∈integer), a combining double character and a base character 2.

Figure 8:
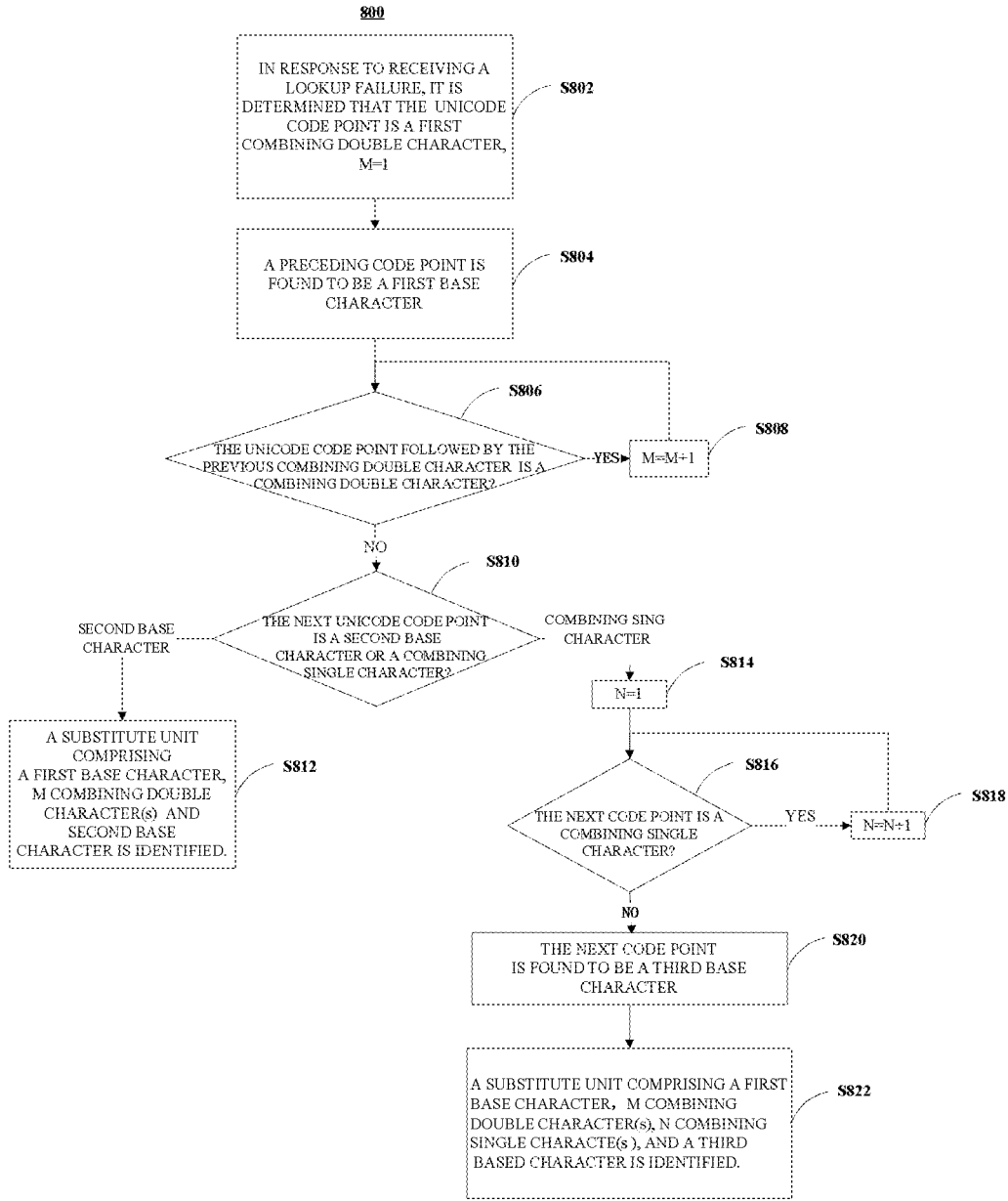
FIG. 8 depicts a flowchart of an example method 800 for identifying a combination unit according to an embodiment of the present invention.

FIG. 8 depicts a flowchart of an example method 800 for identifying a combination unit in Unicode character encoding according to an embodiment of the present invention. Assuming the received source data string is in the Unicode character encoding. A Unicode code point is obtained from the source data string, a target code point corresponding to the Unicode code point is looked up in the map table, wherein the target code point is in a second character encoding. The method 800 starts at step S802, in response to receiving a lookup failure, it is determined that the Unicode code point is a first combining double character, and M is set to be "1". At step S804, a first base character is found preceding the first combining double character. The first combining double character is next to the first base character in the source data string. At step S806, it is determined whether the Unicode code point next to the previous combining double character is a combining double character. If the determination result is "Yes", then the method goes to the step S808 and "M+1" is assigned to "M". Then the method goes back to step S806. The loop from step S806 to step S806 would not stop until the next Unicode code point is found not to be a combining double character. If the determination result is "No", at step S810, it is determined that whether the Unicode code point next to the last combining double character is a second base character or a combining single character. If the determination result is a second base character, a combination unit comprising a first base character, a second base character and M combining double character(s) (M≥1, M∈integer) can be identified. If determination result is a combining single character, the method goes to step S814, N is set to be 1. Then at step S816, it is determined whether the next Unicode code point is a combining single character. If the determination result is Yes, then the method goes to the step S818 and "N+1" is assigned to "N". Then the method goes back to step S816. The loop would not stop until the next Unicode code point is found not to be a combining single character. At step S820, the next Unicode code point is found to be a third character. Then at step S822, a combination unit comprising a first base character, M combining double character(s) (M≥1, M∈integer), N combining single character(s) (N≥1, N∈integer), and a third base character can be identified.

According to one embodiment, the first combining character is a first combining double character. If M=1, the combination unit comprises a first base character, a second base character and a first combining double character. The first combining double character is between the first base character and the second base character in the source data string. The first base character and the second base character can be obtained base on the location relationship with the first combining double character. With reference to FIG. 9, the combination unit 3 is an example combination unit according to the embodiment of the present invention. The combination unit 3 comprises a base character 1, a combining double character and a base character 2.

According to one embodiment, the first combining character is a first combining double character. If M>1, the combination unit comprises a first base character, a second base character and M combining double characters. The M combining double characters include a first combining double character and other (M−1) combining double character(s). The first combining double character is followed by the first base character in the source data string. The other (M−1) combining double character(s) is followed by the first combining double character in the source data string. The M combining double characters are between the first base character and the second base character. The first base character in the source data string, the second base character and other at least one combining double character can be obtained base on location relationship with the first combining double character. The combination unit 4 in FIG. 9 is an example combination unit according to the embodiment of the present invention. The combination unit 4 comprises a base character 1, M combining double characters (M>1, M∈integer) and a base character 2.

According to one embodiment, the first combining character is a first combining double character. The combination unit comprises a first base character, M combining double character(s) (M≥1, M∈integer), N combining single character(s), a second base character. The M combining double character(s) comprise a first combining double character and other (M−1) combining double character(s) (M≥1, M∈integer). The N combining single character(s) (N≥1, N∈integer) is followed by the M combining double character(s) in the source data string. The M combining double character(s) and the N combining single character(s) are between the first base character and the second base character in the source data string. The first base character, the second base character, the (M−1) combining double character(s) and N combining single character(s) can be obtained base on location relationship with the first combining double character. The combination unit 6 is an example combination unit according to the embodiment of the present invention. The combination unit 6 comprises a base character 1, M combining double character(s) (M≥1, M∈integer), N combining single character(s) (N≥1, N∈integer), a base character 2.

At step S610, after the combination unit is identified, the controller 507 may trigger the combination unit converter 511 to convert the combination unit to a substitute character in the target data string. The target code points corresponding to the combination unit can be replaced by the substitute character in the cache. The substitute character can be any predefined character. Also, the substitute character can be determined according to predefined rules. After completing conversion of the combination unit, the controller 507 would inform the code converter 504 to continue to convert the code points following the combination unit in the source data string to target code points in the second character encoding. If the target code points for all code points of the source data string to be processed can be determined, the target code points for the source data string can be transferred from the cache to the output buffer 409. The conversion process for the source data string is completed.

Figure 10:
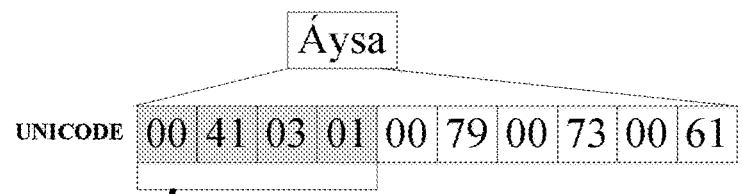
FIG. 10 depicts examples of Unicode conversion according to embodiments of the present invention.
Figure 10:
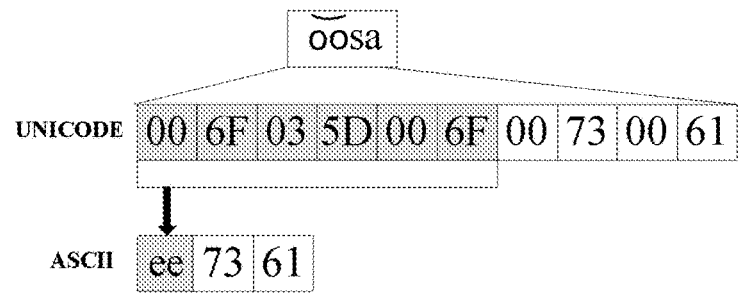

FIG. 10 depicts examples of Unicode conversion according to embodiments of the present invention. In these two embodiments, the Unicode code point in UTF-16 character encoding is two-bytes long under certain circumstance, while a convention code point in a target ASCII character encoding is one-byte long. So a Unicode code point is represented in hexadecimal with a preceding U (e.g., U+0041), and a convention code point in a target ASCII character encoding is represented in hexadecimal with a preceding x (e.g., 0x41). According to an embodiment of present disclosure, the Unicode data string <U+0041 U+0301 U+0079 U+0073 U+0061> corresponding to "Aysa" is received by the code conversion system 407. The Unicode data string <U+0041 U+0301 U+0079 U+0073 U+0061> needs to be converted to a target data string in a target ASCII character encoding. During the Unicode code point conversion, the code converter 504 cannot find a conversion code point of Unicode code point<U+0301> in the mapping table 506. So the code converter 504 can report a lookup failure to the controller 507. The controller 507 can trigger the combining character verification handler 508 to identify if the lookup failure is caused by a combining character. In response to finding the Unicode code point <U+0301> in the combining character table 509, it can be determined that the lookup failure is caused by a combining single character <U+0301>. According to above method 700 for identifying a combination unit, <U+0041 U+0301> can be identified to be a combination unit, in which <U+0041> indicates a base character (A), and <U+0301> indicates a combining single character (́). The combination unit <U+0041 U+0301> indicates that the combining single character (́) combines a base character (A) to create a combined character (Á). With reference to FIG. 10, according to an embodiment of present disclosure, the combination unit <U+0041 U+0301> can be converted to a substitute characters <ee> in the target ASCII character encoding.

According to another embodiment of present disclosure, the Unicode data string <U+006F U+035D U+006F U+0073 U+0061> corresponding to "͝oosa" is received by the code conversion system 407. The Unicode data string <U+006F U+035D U+006F U+0073 U+0061> needs to be converted to a target data string in a target ASCII character encoding.

During the Unicode code point conversion, the code converter 504 cannot find a target code point in a target character encoding for Unicode code point<U+035D> in the mapping table 506. So the code converter 504 can report a lookup failure to the controller 507. The controller 507 can trigger the combining character verification handler 508 to identify if the lookup failure is caused by a combining character. In response to finding the Unicode code point <U+035D> in the combining character table 509, it can be determined that the lookup failure is caused by a combining double character <U+035D>. According to above method 800 for identifying a combination unit, <U+006F U+035D U+006F> can be identified to be a combination unit, in which <U+006F> indicates a base character (o), and <U+035D> indicates a combining double character ( $\frown$ ). The combination unit <U+006F U+035D U+006F> indicates that the combining double character ( $\frown$ ) combines two base characters "o" to create a combined character ($\widehat{oo}$). With reference FIG. 10, according to an embodiment of present disclosure, the combination unit <U+006F U+035D U+006F> can be converted to a substitute character <ee> in the target ASCII character encoding.

Above code conversion examples from the Unicode character encoding to the ASCII character encoding are only illustrative but not intended to suggest any limitation to the scope of present disclosure. It can be understood for the skilled in the art, the code conversion from a first character encoding to a second character encoding according to the embodiments of present disclosure can be applied to any known or future emerging code standards which can support combining characters.

It should be noted, although the combining single character or the combining double character in above embodiments intends to modify one or two base character(s), it is possible that the combining single character or the combining double character intends to exist independently without modifying one or two base character(s). In this situation, the combination unit can still be identified according to the embodiments of present disclosure.

According to the embodiment of present disclosure, a combination unit can be converted to a substitute character in the target data string in the target character encoding, unexpected increase in the length of the target data string in the target character encoding cannot occur. Therefore, program exception interrupt, dead cycle and uncontrollable data loss caused by truncation or overwriting can be avoided.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
   obtaining, by one or more processors, a first code point from a source data string in a first character encoding, wherein the source data string is to be converted to a target data string in a second character encoding;
   looking up, by one or more processors, a target code point corresponding to the first code point in a map table, the target code point being in the second character encoding;
   determining, by one or more processors, whether the first code point is a first combining character in response to receiving a lookup failure generated from the looking up operation;
   identifying, by one or more processors, a combination unit comprising the first combining character and at least one base character next to the first combining character in the source data string in response to determining that the first code point is the first combining character; and
   converting, by one or more processors, the combination unit to a substitute character in the target data string.

2. The method of claim 1, wherein the determining whether the first code point is a first combining character further comprises:
   searching, by one or more processors, the first code point in a combination character table; and
   determining, by one or more processors, that the first code point is a first combining character in response to finding the first code point in the combination character table.

3. The method of claim 1, wherein the first combining character is a combining single character, wherein the combination unit comprises the first combining character and a first base character being preceding to the first combining character in the source data string.

4. The method of claim 3, wherein the combination unit further comprises at least one combining single character next to the first combining character in the source data string.

5. The method of claim 1, wherein the first combining character is a combining double character, wherein the combination unit comprises a first base character, a second base character and the first combining character, the first combining character being between the first base character and the second base character.

6. The method of claim 5, wherein the combination unit further comprises at least
   one combining double character next to the first combining character in the source data string, the first combining character and the at least one combining double character being between the first base character and the second base character.

7. The method of claim 5, wherein the combination unit further comprises at least
   one combining single character, the at least one combining single character being between the first base character and the first combining character.

8. The method of claim 5, wherein the combination unit further comprises at least
   one combining single character, the at least one combining single character being between the first combining character and the second base character.

9. The method of claim 1, wherein the first character encoding is a Unicode character encoding.

10. A computer system comprising:
    one or more processors;
    a memory coupled to the one or more processors, wherein the memory comprises program instructions that when executed by the one or more processors implements a method comprising:
       obtaining, by one or more processors, a first code point from a source data string in a first character encoding, wherein the source data string is to be converted to a target data string in a second character encoding;

looking up, by one or more processors, a target code point corresponding to the first code point in a map table, the target code point being in the second character encoding;

determining, by one or more processors, whether the first code point is a first combining character in response to receiving a lookup failure generated from the looking up operation;

identifying, by one or more processors, a combination unit comprising the first combining character and at least one base character next to the first combining character in the source data string in response to determining that the first code point is the first combining character; and converting, by one or more processors, the combination unit to a substitute character in a target data string.

11. The computer system of claim 10, wherein the determining whether the first code point is a first combining character further comprises:

searching, by one or more processors, the first code point in a combination character table; and determining, by one or more processors, that the first code point is a first combining character in response to finding the first code point in the combination character table.

12. The computer system of claim 10, wherein the first combining character is a combining single character, wherein the combination unit comprises the first combining character and a first base character being preceding to the first combining character in the source data string.

13. The computer system of claim 12, wherein the combination unit further comprises at least one combining single character next to the first combining character in the source data string.

14. The computer system of claim 10, wherein the first combining character is a combining double character, wherein the combination unit comprises a first base character, a second base character and the first combining character, the first combining character being between the first base character and the second base character.

15. The computer system of claim 12, wherein the first character encoding is a Unicode character encoding.

16. A computer program product comprising a computer readable non-transitory storage medium having program instructions embodied therewith, the program instructions executable by one or more processors to cause the one or more processors to perform actions of:

obtaining, by one or more processors, a first code point from a source data string in a first character encoding, wherein the source data string is to be converted to a target data string in a second character encoding;

looking up, by one or more processors, a target code point corresponding to the first code point in a map table, the target code point being in the second character encoding;

determining, by one or more processors, whether the first code point is a first combining character in response to receiving a lookup failure generated from the looking up operation;

identifying, by one or more processors, a combination unit comprising the first combining character and at least one base character next to the first combining character in the source data string in response to determining that the first code point is the first combining character; and converting, by one or more processors, the combination unit to a substitute character in the target data string.

17. The computer program product of claim 16, wherein the determining whether the first code point is a first combining character further comprises:

searching, by one or more processors, the first code point in a combination character table; and determining, by one or more processors, that the first code point is a first combining character in response to finding the first code point in the combination character table.

18. The computer program product of claim 16, wherein the first combining character is a combining single character, wherein the combination unit comprises the first combining character and a first base character being preceding to the first combining character in the source data string.

19. The computer program product of claim 16, wherein the first combining character is a combining double character, wherein the combination unit comprises a first base character, a second base character and the first combining character, the first combining character being between the first base character and the second base character.

20. The computer program product of claim 16, wherein the first character encoding is a Unicode character encoding.

* * * * *